(12) United States Patent
Kim et al.

(10) Patent No.: US 10,954,441 B2
(45) Date of Patent: Mar. 23, 2021

(54) QUANTUM DOTS

(71) Applicant: SAMSUNG ELECTRONICS CO., LTD., Suwon-si (KR)

(72) Inventors: Tae Hyung Kim, Seoul (KR); Jeong Hee Lee, Seongnam-si (KR); Sung Woo Kim, Hwaseong-si (KR); Jin A Kim, Suwon-si (KR); Yuho Won, Seoul (KR); Eun Joo Jang, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/298,276

(22) Filed: Mar. 11, 2019

(65) Prior Publication Data

US 2019/0276738 A1 Sep. 12, 2019

(30) Foreign Application Priority Data

Mar. 9, 2018 (KR) .................. 10-2018-0028319

(51) Int. Cl.
*C09K 11/88* (2006.01)
*H01L 51/50* (2006.01)
(Continued)

(52) U.S. Cl.
CPC ............ *C09K 11/883* (2013.01); *C09K 11/02* (2013.01); *H01L 51/502* (2013.01);
(Continued)

(58) Field of Classification Search
CPC ......... B82Y 40/00; B82Y 30/00; B82Y 20/00; C09K 11/883; C09K 11/0811; C09K 11/574
(Continued)

(56) References Cited

U.S. PATENT DOCUMENTS

| 5,140,385 A | 8/1992 | Kukimoto et al. |
| 9,698,311 B2 | 7/2017 | Greco et al. |
| (Continued) | | |

FOREIGN PATENT DOCUMENTS

| CN | 105399136 A | 3/2016 |
| CN | 106381146 A | 2/2017 |
| (Continued) | | |

OTHER PUBLICATIONS

Angela Fiore et al., "Raman and photoluminescence spectra of ZnTe/CdSe and ZnTe/CdTe tetrapod shaped nano-hetero structures," Superlattices and Microstructures, Oct. 27, 2017, pp. 143-146, vol. 113.
(Continued)

*Primary Examiner* — Jonathan Han
(74) *Attorney, Agent, or Firm* — Cantor Colburn LLP

(57) ABSTRACT

A quantum dot includes a core including a first semiconductor nanocrystal material including zinc, tellurium, and selenium; and a semiconductor nanocrystal shell disposed on (e.g., directly on) the core and including zinc, selenium, and sulfur, wherein the quantum dot does not include cadmium, wherein a size of the quantum dot is greater than or equal to about 10 nanometers (nm) and the quantum dot includes at least four protrusions. A production method thereof and an electronic device including the same are also disclosed.

24 Claims, 12 Drawing Sheets

(51) Int. Cl.
*H05B 33/14* (2006.01)
*C09K 11/02* (2006.01)
*B82Y 20/00* (2011.01)
*B82Y 40/00* (2011.01)

(52) U.S. Cl.
CPC ...... *H01L 51/5056* (2013.01); *H01L 51/5072* (2013.01); *H01L 51/5092* (2013.01); *H01L 51/5096* (2013.01); *H05B 33/14* (2013.01); *B82Y 20/00* (2013.01); *B82Y 40/00* (2013.01)

(58) Field of Classification Search
USPC ........... 977/774; 252/519.14, 519.4, 301.6 R
See application file for complete search history.

(56) References Cited

U.S. PATENT DOCUMENTS

| | | | |
|---|---|---|---|
| 9,887,318 | B2 | 2/2018 | Titov et al. |
| 9,957,442 | B2 | 5/2018 | Banin et al. |
| 2005/0214536 | A1* | 9/2005 | Schrier ............... H01L 33/28 428/403 |
| 2009/0108235 | A1 | 4/2009 | Ando et al. |
| 2009/0230382 | A1 | 9/2009 | Banin et al. |
| 2010/0025637 | A1 | 2/2010 | Asokan et al. |
| 2010/0044635 | A1* | 2/2010 | Breen ............... C09K 11/025 252/301.6 S |
| 2013/0115455 | A1 | 5/2013 | Banin et al. |
| 2014/0117292 | A1* | 5/2014 | Jun ............... H01L 31/0304 252/519.14 |
| 2014/0339497 | A1 | 11/2014 | Qu et al. |
| 2015/0262727 | A1* | 9/2015 | Cho ............... C09K 11/565 252/519.2 |
| 2016/0160060 | A1* | 6/2016 | Kikuchi ............... H05B 33/12 313/503 |
| 2016/0167965 | A1* | 6/2016 | Jang ............... C09K 11/00 252/519.14 |
| 2016/0225958 | A1 | 8/2016 | Kazama et al. |
| 2016/0333267 | A1 | 11/2016 | Chen et al. |
| 2017/0352779 | A1* | 12/2017 | Kuzumoto ............. C08K 3/013 |
| 2018/0026166 | A1 | 1/2018 | Kazama et al. |
| 2018/0158985 | A1 | 6/2018 | Titov et al. |
| 2018/0201834 | A1 | 7/2018 | Banin et al. |

FOREIGN PATENT DOCUMENTS

| | | |
|---|---|---|
| EP | 3037195 A1 | 6/2016 |
| EP | 3401380 A1 | 11/2018 |
| JP | 2016145328 A | 8/2016 |
| KR | 20040032456 A | 4/2004 |
| KR | 20120088273 A | 8/2012 |
| KR | 20130102072 A | 9/2013 |
| KR | 20140121351 A | 10/2014 |
| KR | 20150035300 A | 4/2015 |
| KR | 20170080795 A | 7/2017 |
| WO | 2012161065 A1 | 11/2012 |

OTHER PUBLICATIONS

Extended European Search Report dated Jul. 9, 2019, of the corresponding European Patent Application No. 19161974.1.
Aqiang Wang et al., "Bright, efficient, and color-stable violet ZnSe-based quantum dot light-emitting diodes," Nanoscale, Jan. 5, 2015, pp. 2951-2959, vol. 7.
Christian Ippen et al. "ZnSe/ZnS quantum dots as emitting material in blue QD-LEDs with narrow emission peak and wavelength tunability," Organic Electronics, Nov. 15, 2013, pp. 126-131, vol. 15.
Huaibin Shen et al., "Size- and shape-controlled synthesis of ZnSe nanocrystals using SeO2 as selenium precursor," Dalton Transactions, Oct. 26, 2010, pp. 11432-11438, vol. 39.
Joren Filers et al., "Unravelling the Size and Temperature Dependence of Exciton Lifetimes in Colloidal ZnSe Quantum Dots," The Journal of Physical Chemistry, Sep. 22, 2014, pp. 23313-23319, vol. 118, Issue No. 40.
Lanlan Chen et al., "Green chemical approaches to ZnSe quantum dots: preparation, characterisation and formation mechanism," Journal of Experimental Nanoscience, Mar. 24, 2010, pp. 106-117, vol. 5, No. 2.
Non-Final Office Action dated Mar. 24, 2020 in U.S. Appl. No. 16/298,357.
Final Office Action dated Jul. 27, 2020 in U.S. Appl. No. 16/298,108.
Extended European Search Report dated Jul. 9, 2019, of the corresponding European Patent Application No. 19161979.0.
Huaibin Shen et al., "Phosphine-free synthesis of high quality ZnSe, ZnSe/ZnS, and Cu-, Mn-doped ZnSe nanocrystals," Dalton Transactions, Oct. 30, 2009, pp. 10534-10540.
Kipil Lim et al., "Synthesis of blue emitting InP/ZnS quantum dots through control of competition between etching and growth," Nanotechnology, Nov. 9, 2012, pp. 1-7, vol. 23, No. 485609.
Non-Final Office Action, dated Feb. 13, 2020 of U.S. Appl. No. 16/298,108.
Wenyu Ji et al., "High color purity ZnSe/ZnS core/shell quantum dot based blue light emitting diodes with an inverted device structure," Applied Physics Letters, Jul. 30, 2013, pp. 053106-1~053106-4, vol. 103.
Chunliang Li et al., "Synthesis of Cd-free water-soluble ZnSe1-xTex nanocrystals with high luminescence in the blue region," Journal of Colloid and Interface Science, Feb. 14, 2008, pp. 468-476, vol. 321.
Kiran G Sonawane, Ch Rajesh, Mayur Temgire, Shailaja Mahamuni. A case study: Te in ZnSe and Mn-doped ZnSe quantum dots. Nanotechnology 2011, 22 (30), 305702.

* cited by examiner

QUANTUM DOTS

CROSS-REFERENCE TO RELATED APPLICATION

This application claims priority to and the benefit of Korean Patent Application No. 10-2018-0028319 filed in the Korean Intellectual Property Office on Mar. 9, 2018, and all the benefits accruing therefrom under 35 U.S.C. § 119, the entire content of which is incorporated herein by reference.

BACKGROUND

1. Field

Quantum dots are disclosed.

2. Description of the Related Art

Unlike bulk materials, physical characteristics (e.g., energy bandgaps and melting points) of nanoparticles may be controlled by changing the nanoparticle sizes. For example, a semiconductor nanocrystal particle (also known as a quantum dot) is a crystalline material having a size of several nanometers. The semiconductor nanocrystal particle has a relatively small size and a relatively large surface area per unit volume and exhibits a quantum confinement effect, and thus may have different properties than bulk materials having the same composition. A quantum dot may absorb light from an excitation source to be excited, and may emit energy corresponding to the energy bandgap of the quantum dot.

Quantum dots may be synthesized using a vapor deposition method such as metal organic chemical vapor deposition (MOCVD), molecular beam epitaxy (MBE), or the like, a wet chemical method including adding precursor materials to an organic solvent to grow crystals, or the like. In the wet chemical method, organic compounds such as ligands/coordinating solvents may be coordinated on, e.g., bound to, surfaces of nanocrystals to control a crystal growth during the crystal growth.

In order to improve photoluminescence properties of quantum dots, a core-shell structure may be used, but core-shell quantum dots having improved properties may include cadmium-based materials. Accordingly, there remains a need for development of cadmium-free semiconductor nanocrystal particles having desirable photoluminescence properties.

SUMMARY

An embodiment provides a cadmium-free quantum dot capable of emitting blue light with improved electroluminescent properties.

An embodiment provides a method of manufacturing the quantum dot.

An embodiment provides an electronic device including the quantum dot.

In an embodiment, a quantum dot includes a core including a first semiconductor nanocrystal material including zinc, tellurium, and selenium; and a semiconductor nanocrystal shell disposed on (e.g., directly on) the core and including zinc, selenium, and sulfur, wherein the quantum dot does not include cadmium, wherein a size of the quantum dot is greater than or equal to about 10 nanometers (nm) and the quantum dot (e.g., the semiconductor nanocrystal shell) has at least four protrusions.

In the quantum dot, a mole ratio of tellurium with respect to selenium may be greater than or equal to about 0.001:1.

In the quantum dot, a mole ratio of tellurium with respect to selenium may be less than or equal to about 0.05:1.

A maximum photoluminescent peak wavelength of the quantum dot may be greater than or equal to about 450 nanometers (nm).

A maximum photoluminescent peak wavelength of the quantum dot may be less than or equal to about 470 nm.

A photoluminescent peak of the quantum dot may have a full width at half maximum of less than or equal to about 50 nm, less than or equal to about 45 nm, less than or equal to about 40 nm, or less than or equal to about 36 nm.

The core may include $ZnTe_xSe_{1-x}$, wherein, x is greater than 0 and less than or equal to about 0.05.

A size of the core may be greater than or equal to about 2 nm.

The semiconductor nanocrystal shell may have a gradient composition varying in a radial direction from the core toward an outermost surface of the quantum dot. In the semiconductor nanocrystal shell, an amount of the sulfur may increase in a radial direction from the core toward an outermost surface of the quantum dot.

The semiconductor nanocrystal shell may include a first layer disposed directly on the core and an outer layer(s) disposed on the first layer. The first layer may include a second semiconductor nanocrystal. The outer layer(s) may include a third semiconductor nanocrystal having a composition different from that of the second semiconductor nanocrystal.

The second semiconductor nanocrystal may include zinc and selenium, and optionally sulfur. The outer layer may include zinc and sulfur. An outermost layer of the semiconductor nanocrystal shell may not include selenium.

At least one of the protrusions of the quantum dot may have a length of greater than or equal to about 1 nm, for example, greater than or equal to about 2 nm, or greater than or equal to about 3 nm.

In a two-dimensional image obtained from an electron microscopic analysis, an area ratio of the quantum dot with respect to a circumscribed circle may be greater than or equal to about 0.4:1. The circumscribed circle may be a smallest circle completely surrounding the quantum dot and an outermost point of the quantum dot may be on a circumference of the circumscribed circle.

In a two-dimensional image obtained from an electron microscopic analysis, at least one of the protrusions of the quantum dot may have an edge point angle of less than or equal to about 70 degrees. The edge point angle may be an angle between two surfaces of the quantum dot defining the at least one of the pods in the two-dimensional image.

The quantum dot may have quantum efficiency of greater than or equal to about 70%.

A full width at half maximum (FWHM) of a maximum photoluminescent peak of the quantum dot may be less than about 35 nm.

The quantum dot may have a size of greater than or equal to about 11 nm.

In an embodiment, a method of producing the aforementioned quantum dot includes:

preparing a core including a first semiconductor nanocrystal including zinc, selenium, and tellurium; and reacting a zinc precursor and a selenium precursor, a sulfur precursor, or a combination thereof in a plurality of steps in the presence of the core and an organic ligand in an organic solvent at a temperature of greater than or equal to about 300° C. to form a semiconductor nanocrystal shell including zinc, selenium, and sulfur and having at least four protrusions.

In the core including the first semiconductor nanocrystal, a ratio of the tellurium with respect to the selenium may be less than about 0.05:1.

Formation of the semiconductor nanocrystal shell may include reacting the zinc precursor and the selenium precursor and then reacting the zinc precursor and the sulfur precursor.

In an embodiment, an electroluminescent device may include a first electrode and a second electrode facing each other and a light emitting layer (i.e., quantum dot emission layer) disposed between the first electrode and the second electrode and including a plurality of quantum dots, and the plurality of quantum dots may include the aforementioned quantum dot.

The electroluminescent device may further include a charge auxiliary layer between the first electrode and the light emitting layer, between the second electrode and the light emitting layer, or between the first electrode and the light emitting layer and between the second electrode and the light emitting layer.

The charge auxiliary layer may include a charge injection layer, a charge transport layer, or a combination thereof.

A peak external quantum efficiency (EQE) of the electroluminescent device may be greater than or equal to about 4%.

The electroluminescent device may configured to emit light having a maximum luminous peak wavelength between about 450 nm and about 460 nm and a full width at half maximum of less than or equal to about 25 nm.

In an embodiment, a display device includes the aforementioned electroluminescent device.

A cadmium-free quantum dot capable of emitting blue light may be provided. The quantum dot may be applied to various display devices, biolabeling (biosensor, bioimaging), a photodetector, a solar cell, a hybrid composite, or the like. The quantum dots of an embodiment may exhibit improved EQE and increased maximum (Max) brightness when they are applied in an electroluminescent device. The quantum dots of an embodiment may show decreased FWHM and increased quantum efficiency.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
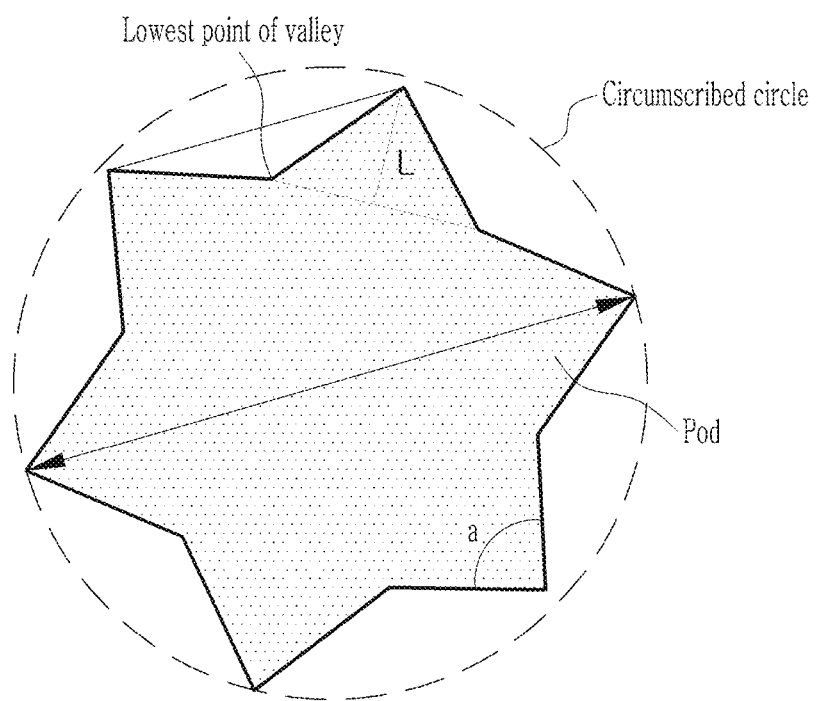
FIG. 1 is a schematic view of a two-dimensional image of the quantum dot according to an embodiment (for example, obtained from an electron microscopic analysis).

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety wherein at least one of hydrogen atoms thereof is replaced by a substituent, wherein the substituent may be a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, a hydrocarbon group refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

As used herein, "alkyl" refers to a linear or branched saturated monovalent hydrocarbon group (methyl, ethyl hexyl, etc.).

As used herein, "alkenyl" refers to a linear or branched monovalent hydrocarbon group having one or more carbon-carbon double bond.

As used herein, "alkynyl" refers to a linear or branched monovalent hydrocarbon group having one or more carbon-carbon triple bond.

As used herein, "aryl" refers to a group formed by removal of at least one hydrogen from an aromatic group (e.g., a phenyl or naphthyl group).

As used herein, "hetero" refers to one including one or more (e.g., 1 to 3) heteroatom of N, O, S, Si, P, or a combination thereof.

As used herein, "Group" refers to a group of Periodic Table.

Semiconductor nanocrystal particles (hereinafter, also referred to as a quantum dot) may absorb light from an excitation source and may emit light corresponding to an energy bandgap thereof. The energy bandgap of the quantum dot may be changed depending on a size and a composition thereof. For example, as the size of the quantum dot increases, the quantum dot may have a narrower energy bandgap and may show an increased light emitting wavelength. Semiconductor nanocrystals may be used as a light emitting material in various fields such as a display device, an energy device, or a bio light emitting device.

Quantum dots having photoluminescence properties may include cadmium (Cd). The cadmium may raise environmental and/or health issues and is a restricted element defined under Restriction of Hazardous Substances Directive (RoHS) in a plurality of countries. Accordingly, there remain needs for development of a cadmium-free quantum dot having improved photoluminescence characteristics. For example, developing a cadmium free quantum dot capable of emitting blue light may be advantageous. In addition, there is a need to develop a cadmium free quantum dot capable of showing a reduced FWHM, enhanced external quantum efficiency, and increased brightness in an electroluminescent device.

A quantum dot according to an embodiment has a structure and a composition that will be described below, and thereby may emit light with a desired wavelength (e.g., blue light) and improved properties in an electroluminescent device.

A quantum dot (for example, quantum dots or a plurality of quantum dots) of an embodiment does not include cadmium. The quantum dot or the core of an embodiment may not include manganese, copper, or a combination thereof. A quantum dot of an embodiment includes a core including a first semiconductor nanocrystal including zinc, tellurium, and selenium; and a semiconductor nanocrystal shell disposed on at least a portion of the core and including zinc, selenium, and sulfur. The quantum dot (or the quantum dots) has (have) a particle size (e.g., an average particle size) of greater than or equal to about 10 nm and the semiconductor nanocrystal shell has at least four pods (on average). In an embodiment, a pod (or protrusion) may be a protruding portion separated from one another in a two-dimensional image of the quantum dot obtained from an electron microscopic analysis (see FIG. 1). As used herein, the wording "pod" and the wording "protrusion" may be used interchangeably.

In the quantum dot of an embodiment, a mole ratio of tellurium with respect to selenium may be greater than or equal to about 0.001:1. A mole ratio of tellurium with respect to selenium may be less than or equal to about 0.05:1. The quantum dot of an embodiment may emit blue light. The blue light has a maximum luminescent peak in a wavelength range of greater than or equal to about 450 nm and less than or equal to about 470 nm. The maximum luminescent peak of the quantum dot may have a full width at half maximum of less than or equal to about 41 nm, for example, about 40 nm.

In the cores, the first semiconductor nanocrystal may include a limited amount of tellurium. The core may include ZnTe$_x$Se$_{1-x}$, wherein x is greater than 0 and less than or equal to about 0.05.

For example, in the core or the quantum dot of an embodiment, the amount of the tellurium may be greater than or equal to about 0.001 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, greater than or equal to about 0.02 moles, or greater than or equal to about 0.025 moles with respect to one mole of the selenium. In the core or in the quantum dot, the amount of the tellurium with respect to one mole of the selenium may be less than or equal to about 0.053 moles, for example, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, less than or equal to about 0.04 mole, less than or equal to about 0.035 moles, less than or equal to about 0.03 moles, less than or equal to about 0.025 moles, or less than or equal to about 0.02 moles.

The core may have a size (an average size) (e.g., a diameter or an average diameter) that is greater than or equal to about 2 nm, greater than or equal to about 3 nm, or greater than or equal to about 3.5 nm. The (average) size of the core may be less than or equal to about 5 nm, or less than or equal to about 4 nm.

The quantum dot of an embodiment has a semiconductor nanocrystal shell including zinc (Zn), selenium (Se), and sulfur (S) disposed on the core, wherein the quantum dot has a morphology having at least four pods (for example, greater than or equal to about 5 pods, or greater than or equal to about 6 pods) (e.g., on average) in a two-dimensional image as obtained by an electron microscopic analysis thereof (e.g., also referred to as a multipod structure). The (average) number of the pods may be less than or equal to about 15, for example, less than or equal to about 10, less than or equal to about 9, less than or equal to about 8, less than or equal to about 7, or less than or equal to about 6.

Referring to FIG. 1, the quantum dot of an embodiment has 6 pods but the embodiments are not limited thereto. The quantum dot of an embodiment may have a valley, i.e., a space between the adjacent pods. In the quantum dot of an embodiment, the number of valleys (or the lowest points of the valleys) may be greater than or equal to about 2, greater than or equal to about 3, greater than or equal to about 4. In the quantum dot of an embodiment, the number of valleys (or the lowest points of the valleys) may be less than or equal to about 10, less than or equal to about 9, less than or equal to about 8, less than or equal to about 7, less than or equal to about 6, or less than or equal to about 5.

The lowest point of a valley may be a point at which two opposite sides (or the extended lines thereof) of the cross-section of the adjacent two pods meet in a two-dimensional image obtained from an electron microscopic analysis. The lowest point of the valley may be positioned closer to the center of the quantum dot than is a straight line connecting the apex of the adjacent two pods. (see the line of FIG. 1)

In a two-dimensional image obtained from an electron microscopic analysis, at least one pod of the quantum dot may have an edge point angle a of less than about 70 degrees, for example, 69 degrees, less than or equal to about 68 degrees, less than or equal to about 67 degrees, less than or equal to about 66 degrees, less than or equal to about 65 degrees, less than or equal to about 64 degrees, less than or equal to about 63 degrees, less than or equal to about 62 degrees, less than or equal to about 61 degrees, less than or equal to about 60 degrees. The angle may be from about 44 degrees to about 68 degrees. The edge point angle of the quantum dot may be an angle formed by the two opposite sides (or the extended lines thereof) of the cross-section of the adjacent two pods. The edge point angle may be an angle between two surfaces of the quantum dot defining a pod in the two-dimensional image. (see FIG. 1, Angle a).

At least one of the pods of the quantum dot may have a (e.g., protruded) length of greater than or equal to about 0.5 nm, for example, greater than or equal to 1 nm, greater than or equal to about 2 nm, or greater than or equal to about 3 nm, greater than or equal to about 4 nm, or greater than or equal to about 5 nm (for example, as determined by a two-dimensional image of an electron microscopic analysis). The length of the at least one of the pods may be less than or equal to about 20 nm, less than or equal to about 20 nm, less than or equal to about 15 nm, less than or equal to about 10 nm, or less than or equal to about 6 nm. The length of the pod may be determined by an electron microscopic analysis. For example, the length of the pod (protrusion) may be determined as a vertical distance (e.g., height) from an edge point to a straight line linking two lowest points of valleys adjacent to the edge point.

In a two-dimensional image obtained from an electron microscopic analysis of the quantum dot, an area ratio of the quantum dot with respect to a circumscribed circle may be greater than or equal to about 0.4:1, for example, greater than or equal to about 0.5:1, greater than or equal to about 0.51:1, greater than or equal to about 0.52:1, or greater than or equal to about 0.53:1. The circumscribed circle may be a circle, a diameter of which is the greatest length of a straight line linking (for example, opposite two) apexes of the pods, for example, a circle including all the points of the two-dimensional image of the quantum dot obtained from an electron microscopic analysis thereof and having the smallest diameter. The circumscribed circle may be a smallest circle completely surrounding the quantum dot, with an outermost point of the quantum dot being on a circumference of the circumscribed circle. (see FIG. 1 and FIG. 8)

When being applied to an electroluminescent device, the quantum dot(s) of an embodiment that has (have) the aforementioned features of the morphology, the size, and the like may exhibit enhanced properties in comparison with quantum dot(s) that does not have the aforementioned features such as the size and the morphology (e.g., a quantum dot having a substantially circle or not having protruded portions or valley).

In an embodiment, the semiconductor nanocrystal shell may have a gradient composition varying in a radial direction (e.g., from the core). In the semiconductor nanocrystal shell, an amount of the sulfur may increase toward a surface of the quantum dot.

In an embodiment, the semiconductor nanocrystal shell may include at least two layers wherein adjacent layers may have different compositions. In an embodiment, the semiconductor nanocrystal shell may include a first layer disposed directly on the core and at least one outer layer (e.g., a second layer or a third layer) disposed on or over the first layer. The first layer may include a second semiconductor nanocrystal. The outer layer (e.g., a second layer or a third layer over the second layer) may include a third semiconductor nanocrystal having a composition different from the second semiconductor nanocrystal.

The second semiconductor nanocrystal may include zinc, selenium, and optionally sulfur. The semiconductor nanocrystal of the outer layer may include zinc and sulfur, and optionally selenium. The outermost layer of the quantum dot may include a semiconductor nanocrystal that consists of zinc and sulfur.

The outer layer of the semiconductor nanocrystal shell may include a second layer including a third semiconductor nanocrystal including zinc and selenium, and optionally a sulfur, and a third layer including a fourth semiconductor nanocrystal including zinc and sulfur. The third layer may be the outermost layer.

The fourth semiconductor nanocrystal may have an energy bandgap that is greater than the second semiconductor nanocrystal and the third semiconductor nanocrystal. In an embodiment, the second semiconductor nanocrystal may include ZnSe, ZnSeS, or a combination thereof. The third semiconductor nanocrystal may include ZnSeS, ZnS, or a combination thereof. The fourth semiconductor nanocrystal may include (or consist of) ZnS.

In the quantum dot of an embodiment, a mole ratio of tellurium with respect to selenium may be less than or equal to about 0.1:1, less than or equal to about 0.05:1, less than or equal to about 0.049:1, less than or equal to about 0.048:1, less than or equal to about 0.047:1, less than or equal to about 0.046:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.035:1, or less than or equal to about 0.03:1. In the quantum dot of an embodiment, a mole ratio of tellurium with respect to selenium may be greater than or equal to about 0.0001:1, greater than or equal to about 0.005:1, or greater than or equal to about 0.01:1. In the quantum dot, the amount of each of the component may be measured and confirmed via an appropriate analysis tool such as inductively coupled plasma atomic emission spectroscopy (ICP-AES) and the like.

In an embodiment, a quantum dot may have a predetermined mole ratio of tellurium with respect to zinc. In an embodiment, a quantum dot may have a predetermined mole ratio of sulfur with respect to selenium. A quantum dot of an embodiment may have a predetermined mole ratio of a sum of sulfur and selenium with respect to zinc. In an embodiment, a quantum dot may have a predetermined mole ratio of sulfur with respect to zinc. In an embodiment, a quantum dot may have a predetermined mole ratio of selenium with respect to zinc.

In a quantum dot of an embodiment, a mole ratio of tellurium with respect to zinc may be less than 0.01:1, for example, less than or equal to about 0.009:1, less than or equal to about 0.008:1, or less than or equal to about 0.007:1. A mole ratio of tellurium with respect to zinc may be greater than or equal to about 0.001:1, for example, greater than or equal to about 0.002:1, greater than or equal to about 0.003:1, or greater than or equal to about 0.004:1.

In a quantum dot of an embodiment, a mole ratio of selenium with respect to sulfur may greater than or equal to about 0.3:1, for example, greater than or equal to about 0.4:1, or greater than or equal to about 0.5:1. In a quantum dot of an embodiment, a mole ratio of selenium with respect to sulfur may be less than or equal to about 1:1, for example, less than or equal to about 0.9:1, or less than or equal to about 0.8:1.

In a quantum dot of an embodiment, a mole ratio of sulfur with respect to Zn may be greater than or equal to about 0.3:1, greater than or equal to about 0.4:1, greater than or equal to about 0.49:1, or greater than or equal to about 0.5:1. In a quantum dot of an embodiment, a mole ratio of sulfur with respect to Zn may be less than or equal to about 0.9:1.

In a quantum dot of an embodiment, a mole ratio of selenium with respect to Zn may be greater than or equal to about 0.1:1. In a quantum dot of an embodiment, a mole ratio of selenium with respect to Zn may be less than or equal to about 0.47:1, for example, less than or equal to about 0.45:1, less than or equal to about 0.4:1, or less than or equal to about 0.39:1.

The quantum dot of an embodiment may have a size (e.g., an average size) of greater than or equal to about 10 nm, for example, greater than or equal to about 11 nm, or greater than or equal to about 15 nm. The (average) size of the quantum dot may be less than or equal to about 50 nm, for example less than or equal to about 45 nm, less than or equal to about 40 nm, less than or equal to about 35 nm, less than or equal to about 30 nm, less than or equal to about 29 nm, less than or equal to about 28 nm, less than or equal to about 27 nm, or less than or equal to about 26 nm. The size (or the average size) of the quantum dot may be determined from a two-dimensional image obtained by an electron microscopic analysis (e.g., a TEM analysis). In an embodiment, the size (or the average size) of the quantum dot may be a diameter of a circumscribed circle.

A quantum dot of an embodiment may emit blue light having a maximum photoluminescent peak at a wavelength of greater than or equal to about 450 nm, for example, greater than or equal to about 451 nm, greater than or equal to about 455 nm and less than or equal to about 470 nm (e.g., less than about 470 nm, less than or equal to about 465 nm, or less than or equal to about 460 nm). The blue light may have a maximum light-emitting peak wavelength of from about 450 nm to about 460 nm.

The maximum (photoluminescent) peak may have a full width at half maximum (FWHM) of less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, or less than or equal to about 27 nm.

The quantum dot of an embodiment may emit blue light with improved quantum efficiency (also referred to herein as Quantum Yield (QY)) of greater than or equal to about 70%, for example, greater than or equal to about 71%, greater than or equal to about 72%, greater than or equal to about 73%, greater than or equal to about 74%, greater than or equal to about 75%, greater than or equal to about 76%, greater than or equal to about 77%, greater than or equal to about 78%, or greater than or equal to about 79%. The quantum dot may have a quantum efficiency of greater than or equal to about 80%, greater than or equal to about 90%, greater than or equal to about 95%, greater than or equal to about 99%, or 100%.

In an embodiment, a method of producing the quantum dot includes preparing a core including a first semiconductor nanocrystal including zinc, selenium, and tellurium (hereinafter, also referred to as a core); and reacting a zinc precursor and a non-metal precursor of at least one selected from a selenium precursor and a sulfur precursor in a plurality of steps in the presence of the core including the first semiconductor nanocrystal and an organic ligand in an organic solvent at a temperature of greater than or equal to about 300° C. to form a semiconductor nanocrystal shell including zinc, selenium, and sulfur and having the aforementioned morphology on a surface of the core.

The formation of the semiconductor nanocrystal shell may include reacting the zinc precursor and the selenium precursor, and then reacting the zinc precursor and the sulfur precursor.

In an embodiment, the core may be obtained by preparing a zinc precursor solution including a zinc precursor and an organic ligand; preparing a selenium precursor and a tellurium precursor; heating the zinc precursor solution to a first reaction temperature and adding the selenium precursor and the tellurium precursor thereto optionally together with an organic ligand to proceed a reaction therebetween.

The zinc precursor may include a Zn powder, ZnO, an alkylated Zn compound (e.g., C2 to C30 dialkyl zinc such as diethyl zinc), a Zn alkoxide (e.g., a zinc ethoxide), a Zn carboxylate (e.g., a zinc acetate), a Zn nitrate, a Zn perchlorate, a Zn sulfate, a Zn acetylacetonate, a Zn halide (e.g., a zinc chloride), a Zn cyanide, a Zn hydroxide, zinc carbonate, zinc peroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a primary, secondary, or tertiary phosphine oxide (e.g., trioctylphosphine oxide) substituted with a (e.g., 1, 2, or 3) C6 to C22 alkyl group, a C12 to C22 aromatic ether such as a phenyl ether or a benzyl ether, or a combination thereof.

The organic ligand may coordinate, e.g., be bound to, the surface of the produced nanocrystal and may have an effect on the light emitting and electric characteristics as well as may effectively disperse the nanocrystal in the solution phase. The quantum dots of an embodiment may be dispersed in an organic solvent as they include the organic ligand bound to a surface thereof. The organic ligand may include $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR$, $RPO(OH)_2$, $R_2POOH$, wherein R is the same or different and is independently include hydrogen, a substituted or unsubstituted C1 to C24 aliphatic hydrocarbon group, a substituted or unsubstituted C6 to C20 aromatic hydrocarbon group, or a combination thereof provided that at least one of the R is not hydrogen, or a combination thereof. One or more ligands may be used.

Examples of the organic ligand compound may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; phosphine such as methyl phosphine, ethyl phosphine, propyl phosphine, butyl phosphine, pentyl phosphine, tributylphosphine, or trioctylphosphine; a phosphine oxide compound such as methyl phosphine oxide, ethyl phosphine oxide, propyl phosphine oxide, butyl phosphine oxide, or trioctylphosphine oxide; a diphenyl phosphine or triphenyl phosphine compound, or an oxide compound thereof; phosphonic acid, or the like, but are not limited thereto. One or more organic ligand compounds may be used. In an embodiment, the organic ligand compound may be a combination of RCOOH and amine (e.g., $RNH_2$, $R_2NH$, and/or $R_3N$).

In the core including the first semiconductor nanocrystal, a mole ratio of tellurium with respect to selenium may be less than or equal to about 0.05:1. In order to form the core, an amount of the selenium precursor for forming the core may be greater than or equal to about 20 moles, for example, greater than or equal to about 25 moles, greater than or equal to about 26 moles, greater than or equal to about 27 moles, greater than or equal to about 28 moles, greater than or equal to about 29 moles, greater than or equal to about 30 moles, greater than or equal to about 31 moles, greater than or equal to about 32 moles, greater than or equal to about 33 moles, greater than or equal to about 34 moles, greater than or equal to about 35 moles, greater than or equal to about 36 moles, greater than or equal to about 37 moles, greater than or equal to about 38 moles, greater than or equal to about 39 moles, or greater than or equal to about 40 moles, based on one mole of the tellurium precursor. The amount of the selenium precursor may be less than or equal to about 60 moles, less than or equal to about 59 moles, less than or equal to about 58 moles, less than or equal to about 57 moles, less than or equal to about 56 moles, or less than or equal to about 55 moles, based on one mole of the tellurium precursor. Within the foregoing ranges of the amount, the core having the aforementioned composition may be formed.

The first reaction temperature may be greater than or equal to about 280° C., for example, greater than or equal to about 290° C. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours, but is not limited thereto. By controlling the reaction time, the size of the core may be controlled.

Reaction conditions for forming the shell may be selected appropriately in light of a desired composition of the shell. In an embodiment, a solvent and optionally an organic ligand may be heated (or treated under vacuum) at a predetermined temperature (e.g., at a temperature of greater than or equal to about 100° C.) and an atmosphere is changed into an inert gas and then is heated at a predetermined temperature (e.g., at a temperature of greater than or equal to about 100° C.). Then, a core may be injected, and shell precursors may be injected sequentially or simultaneously and a resulting mixture is heated to a predetermined reaction temperature to carry out a reaction.

The shell precursors may be sequentially added for a reaction time for example, as a mixture of a different ratio, to achieve a desired composition and/or a morphology of the quantum dot or to form a gradient or a multi-layered shell on the core. In an embodiment, a first layer may be formed by reacting a zinc precursor and a selenium precursor and then an outer layer may be formed, for example, by reacting a zinc precursor and a sulfur precursor. A reaction temperature for forming the shell may be greater than or equal to about 300° C., or greater than or equal to about 310° C. and less than or equal to about 330° C., or less than or equal to about 325° C.

In a reaction system, an amount and a concentration of the precursor may be selected considering the compositions of the core and the shell and the reactivity between the precursors.

After the completion of the reaction, a non-solvent is added to reaction products and the nanocrystal particles coordinated with, e.g., bound to, the ligand compound may be separated. The non-solvent may be a polar solvent that is miscible with the solvent used in the core formation and/or shell formation reactions and is not capable of dispersing the produced nanocrystals therein. The non-solvent may be selected depending the solvent used in the reaction and may be for example acetone, ethanol, butanol, isopropanol, water, tetrahydrofuran (THF), dimethylsulfoxide (DMSO), diethylether, formaldehyde, acetaldehyde, ethylene glycol, a solvent having a similar solubility parameter to the foregoing non-solvents, or a combination thereof. Separation of the nanocrystal particles may involve centrifugation, sedimentation, chromatography, or distillation. The separated nanocrystal particles may be added to a washing solvent and washed, if desired. Types of the washing solvent are not particularly limited and a solvent having similar solubility parameter to that of the ligand may be used and examples thereof may include hexane, heptane, octane, chloroform, toluene, benzene, or the like.

The quantum dots of the embodiment may not be dispersible to, e.g., in, water, any of the foregoing listed non-solvent, or a mixture thereof. The quantum dots of the embodiment may be water-insoluble. The quantum dots of the embodiments may be dispersed the aforementioned organic solvent. In some embodiments, the quantum dots may be dispersed in a C6 to C40 aliphatic hydrocarbon, a C6 to C40 aromatic hydrocarbon, or a mixture thereof.

In an embodiment, an electronic device includes the semiconductor nanocrystal particle. The device may include a display device, a light emitting diode (LED), an organic light emitting diode (OLED), a quantum dot LED, a sensor, a solar cell, an image sensor, or a liquid crystal display (LCD), but is not limited thereto.

In an embodiment, the electronic device may be a photoluminescent element (e.g., a lighting such as a quantum dot sheet or a quantum dot rail or a liquid crystal display (LCD)) or an electroluminescent device (e.g., QD LED).

In an embodiment, the electronic device may include a quantum dot sheet and the quantum dot may be included in the quantum dot sheet (e.g., in a form of a semiconductor nanocrystal-polymer composite).

Figure 2:
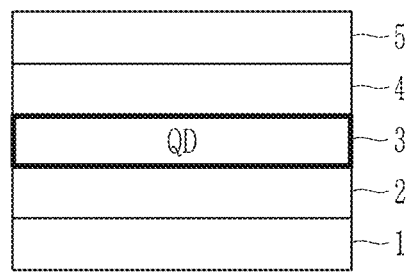
FIG. 2 is a schematic cross-sectional view of a quantum dot (QD) LED device according to an embodiment.

In an embodiment, the electronic device may be an electroluminescent device. The electronic device may include an anode 1 and a cathode 5 facing each other and a quantum dot emission layer 3 disposed between the anode and the cathode and including a plurality of quantum dots, and the plurality of quantum dots may include the blue light emitting semiconductor nanocrystal particle (see FIG. 2).

The cathode may include an electron injection conductor (for example, having a relatively low work function). The anode may include a hole injection conductor (for example, having a relatively high work function). The electron/hole injection conductors may include a metal (e.g., aluminum, magnesium, tungsten, nickel, cobalt, platinum, palladium, or calcium), a metal compound (LiF), an alloy, or a combination thereof; a metal oxide such as gallium indium oxide or indium tin oxide; or a conductive polymer such as polyethylene dioxythiophene (e.g., having a relatively high work function), but are not limited thereto.

At least one of the cathode and the anode may be a light transmitting electrode or a transparent electrode. In an embodiment, both of the anode and the cathode may be light transmitting electrodes. The electrode may be patterned.

The light transmitting electrode may be made of, for example a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multilayer, but is not limited thereto. When one of the cathode and the anode is a non-light transmitting electrode, the non-light transmitting cathode or anode may be made of, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the anode and the cathode are not particularly limited and may be selected considering device efficiency. For example, the thickness of the anode (or the cathode) may be greater than or equal to about 5 nm, for example, greater than or equal to about 50 nm, but is not limited thereto. For example, the thickness of the anode (or the cathode) may be less than or equal to about 100 micrometers (μm), for example, less than or equal to about 10 um, less than or equal to about 1 μm, less than or equal to about 900 nm, less than or equal to about 500 nm, or less than or equal to about 100 nm, but is not limited thereto.

The quantum dot emission layer includes a plurality of quantum dots. The plurality of quantum dots includes the blue light emitting semiconductor nanocrystal particle according to an embodiment. The quantum dot emission layer may include a monolayer of the blue light emitting semiconductor nanocrystal particles.

The emissive layer may be formed by preparing a dispersion including the quantum dots dispersed in a solvent, applying the dispersion via spin coating, ink jet coating, or spray coating, and drying the same. The emissive layer may have a thickness of greater than or equal to about 5 nm, for example, greater than or equal to about 10 nm, greater than or equal to about 15 nm, greater than or equal to about 20 nm, or greater than or equal to about 25 nm, and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

The electronic device may include charge (hole or electron) auxiliary layers between the anode and the cathode. For example, the electronic device may include a hole auxiliary layer 2 between the anode and the quantum dot emission layer and/or an electron auxiliary layer 4 between the cathode and the quantum dot emission layer. (see FIG. 2)

In the figures, the electron/hole auxiliary layer is formed as a single layer, but the electron/hole auxiliary layer is not limited thereto and may include a plurality of layers including at least two stacked layers.

The hole auxiliary layer may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto. The hole injection layer may be an organic layer that is formed by a solution process (e.g., spin coating etc.). The hole transport layer may be an organic layer that is formed by a solution process (e.g., spin coating etc.).

The electron auxiliary layer may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto. The electron injection layer may be an organic layer formed by deposition. The electron transport layer may include an inorganic oxide or nanoparticles thereof or may include an organic layer formed by deposition.

The quantum dot emission layer may be disposed in the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include for example an organic material, an inorganic material, or an organic/inorganic material. The organic material may be a compound having hole or electron-related properties. The inorganic material may be for example a metal oxide such as molybdenum oxide, tungsten oxide, zinc oxide, or nickel oxide, but is not limited thereto.

The hole transport layer (HTL) and/or the hole injection layer may include for example poly(3,4-ethylenedioxythiophene):poly(styrene sulfonate) (PEDOT:PSS), poly(9,9-di-octyl-fluorene-co-N-(4-butylphenyl)-diphenylamine) (TFB), polyarylamine, poly(N-vinylcarbazole (PVK), polyaniline, polypyrrole, N,N,N',N'-tetrakis (4-methoxyphenyl)-benzidine (TPD), 4,4',bis[N-(1-naphthyl)-N-phenyl-amino]biphenyl (α-NPD), m-MTDATA (4,4',4"-tris[phenyl (m-tolyl)amino]triphenylamine), 4,4',4"-tris(N-carbazolyl)-triphenylamine (TCTA), 1,1-bis[(di-4-tolylamino) phenylcyclohexane (TAPC), a p-type metal oxide (e.g., NiO, $WO_3$, $MoO_3$, etc.), a carbonaceous material such as grapheme oxide, or a combination thereof, but is not limited thereto.

The electron blocking layer (EBL) may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly (N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

The electron transport layer (ETL) and/or the electron injection layer may include for example 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (8-(4-(4, 6-di(naphthalen-2-yl)-1,3,5-triazin-2-yl)phenyl)quinolone), 8-hydroxyquinolinato lithium (Liq), an n-type metal oxide (e.g., a zinc oxide, $HfO_2$, etc.), or a combination thereof, but is not limited thereto. In the foregoing "q" is 8-hydroxyquinoline, "BTZ" is 2-(2-hydroxyphenyl)benzothiazolate, and "Bq" is 10-hydroxybenzo[h]quinoline.

The hole blocking layer (HBL) may include for example 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof, but is not limited thereto.

Figure 3:
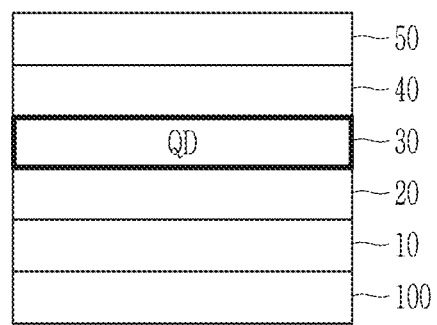
FIG. 3 is a schematic cross-sectional view of a QD LED device according to an embodiment.

In a device according to an embodiment, an anode 10 disposed on a transparent substrate 100 may include a metal oxide transparent electrode (e.g., ITO electrode) and a cathode 50 facing the anode may include a metal (Mg, Al, etc.) of a predetermined (e.g., relatively low) work function. For example, TFB and/or PVK as a hole transport layer 20 and PEDOT:PSS and/or a p-type metal oxide as a hole injection layer 20 may be disposed between the transparent electrode 10 and the emission layer 30. An electron auxiliary layer (e.g., electron transport layer) 40 may be disposed between the quantum dot emission layer 30 and the cathode 50. (see FIG. 3)

Figure 4:
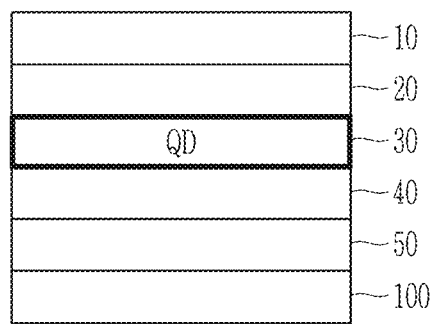
FIG. 4 is a schematic cross-sectional view of a QD LED device according to an embodiment.

A device according to an embodiment has an inverted structure. Herein, a cathode 50 disposed on a transparent substrate 100 may include a metal oxide transparent electrode (e.g., ITO) and an anode 10 facing the cathode may include a metal (e.g., Au, Ag, etc.) of a predetermined (e.g., relatively high) work function. For example, an n-type metal oxide (ZnO) may be disposed between the transparent electrode 50 and the emission layer 30 as an electron auxiliary layer (e.g., an electron transport layer) 40. A hole auxiliary layer 20 (e.g., a hole transport layer including TFB and/or PVK and/or a hole injection layer including MoO₃ or another p-type metal oxide) may be disposed between the metal anode 10 and the quantum dot emission layer 30. (see FIG. 4)

Hereinafter, specific examples are illustrated. However, these examples are exemplary, and the present disclosure is not limited thereto.

EXAMPLES

Analysis Method
1. Photoluminescence Analysis

A photoluminescence (PL) spectrum of the produced nanocrystals are obtained using a Hitachi F-7000 spectrometer at an irradiation wavelength of 372 nanometers (nm).
2. Ultraviolet (UV) Spectroscopy Analysis UV spectroscopy analysis is performed using a Hitachi U-3310 spectrometer to obtain a UV-Visible absorption spectrum.
3. Transmission Electron Microscopy (TEM) Analysis Transmission electron microscopy photographs of nanocrystals are obtained using an UT F30 Tecnai electron microscope and an image program, image J.
4. Inductively Coupled Plasma (ICP) Analysis An inductively coupled plasma-atomic emission spectroscopy (ICP-AES) analysis is performed using Shimadzu ICPS-8100.
5. Electroluminescence Analysis When a voltage is applied, a current depending on the voltage is measured by using a current-voltage (IV) tester 2635B manufactured by Keithley Co., Ltd. and using CS-2000A of Konica Minolta Co., Ltd., an electroluminescent brightness is measured.

Synthesis is performed under an inert gas atmosphere (nitrogen flowing condition) unless particularly mentioned. In the following examples or the like, a (amount) ratio between (or among) the precursors refers to a molar ratio unless defined to the contrary

Synthesis of Quantum Dot

Example 1

Selenium, sulfur, and tellurium are dispersed in trioctylphosphine (TOP) to obtain a 2 molar (M) Se/TOP stock solution, a 2 M S/TOP stock solution, and a 0.1 M Te/TOP stock solution.

1. In a 300 milliliters (mL) reaction flask, zinc acetate is dissolved in trioctyl amine together with palmitic acid, and is heated under vacuum at 120° C. In one hour, an atmosphere in the reactor is converted into nitrogen.

After being heated at 300° C., the prepared Se/TOP stock solution and Te/TOP stock solution are rapidly added in a predetermined ratio. After 60 minutes, a reaction solution is rapidly cooled to room temperature and acetone is added thereto to obtain precipitates, which are separated via centrifugation. The obtained ZnTeSe cores are dispersed in toluene.

The mole ratio between the used Zn precursors and the used Se precursors (Zn:Se) is 2:1 and a mole ratio of Te with respect to Se 0.05:1 (Te:Se).

2. In a 300 mL reaction flask, trioctylamine is placed and zinc acetate and oleic acid are added thereto at a mole ratio of 2:1 and treated at 120° C. under vacuum. The atmosphere inside the flask is replaced with nitrogen ($N_2$). While a temperature of the reaction flask is increased to 300° C., a toluene dispersion of the prepared ZnTeSe core is injected rapidly and then Se/TOP stock solution is added thereto and a reaction proceeds for 120 minutes to form a ZnSe layer on the core. Then, a S/TOP is added together with zinc oleate and a reaction proceeds for 60 minutes to form a ZnS layer on the ZnSe layer. A mole ratio between the amounts of the Zn precursor, the Se precursor, and the S precursor is about 1:0.3:1.1.

3. Analysis (1) With respect to the quantum dots as prepared, a photoluminescent analysis is made and the results are summarized in Table 1.

(2) With respect to the quantum dots as prepared, an inductively coupled plasma atomic emission spectroscopic analysis is made and the results are summarized in Table 2.

Figure 5:
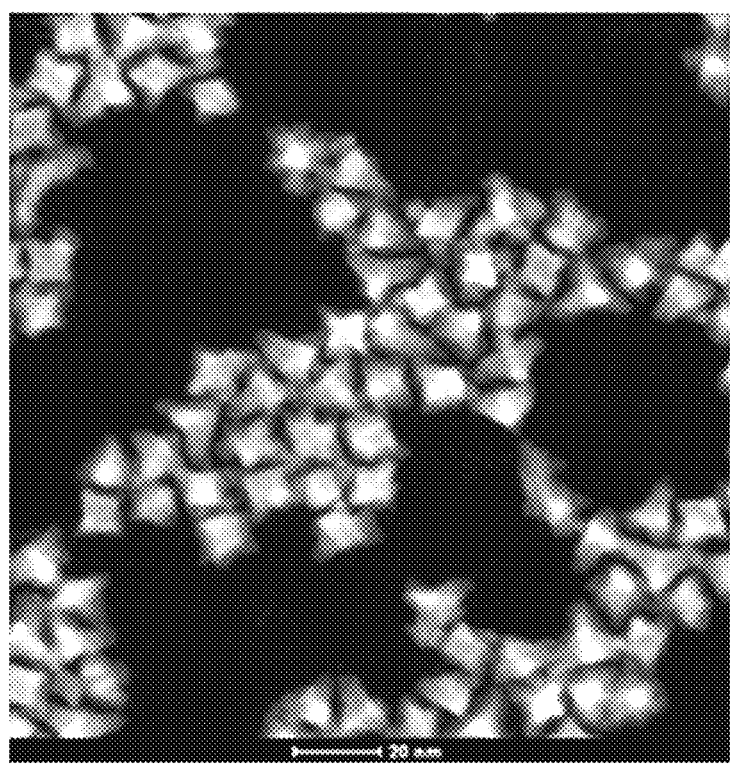
FIG. 5 is a transmission electron microscopic image of the quantum dots (QD2) synthesized in Example 1.

(3) With respect to the quantum dots as prepared, a transmission electron microscopic analysis is made, and the results are shown in FIG. 5. From the results of FIG. 5, the quantum dots as prepared have an average size of about 11 nm and have at least four pods.

Example 2

1. A core-shell quantum dot is prepared in the same manner as Example 1 except that increasing the reaction temperature to 320° C. during the shell formation.

2. Analysis (1) With respect to the quantum dots as prepared, a photoluminescent analysis is made and the results are summarized in Table 1.

(2) With respect to the quantum dots as prepared, an inductively coupled plasma atomic emission spectroscopic analysis is made and the results are summarized in Table 2.

Figure 6:
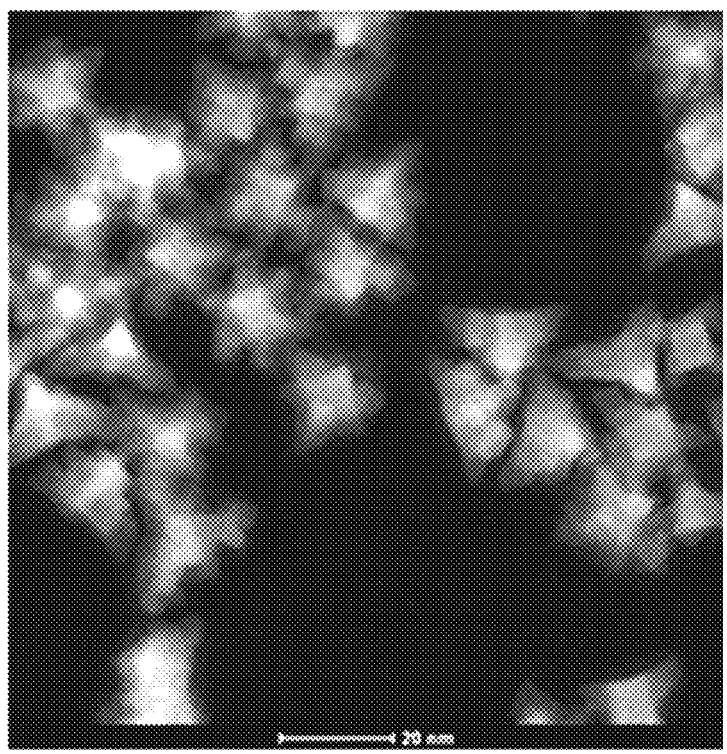
FIG. 6 is a transmission electron microscopic image of the quantum dots (QD3) synthesized in Example 2.

(3) With respect to the quantum dots as prepared, a transmission electron microscopic analysis is made and the results are shown in FIG. 6. From the results of FIG. 6, the quantum dots as prepared have an average size of about 15.1 nm and have at least four pods.

Comparative Example 1

1. A core-shell quantum dot is prepared in the same manner as Example 1 except that Se is not used and a mole ratio of Zn:S=1:0.6 used in the shell formation.

2. Analysis (1) With respect to the quantum dots as prepared, a photoluminescent analysis is made and the results are summarized in Table 1.

(2) With respect to the quantum dots as prepared, an inductively coupled plasma atomic emission spectroscopic analysis is made and the results are summarized in Table 2.

Figure 7:
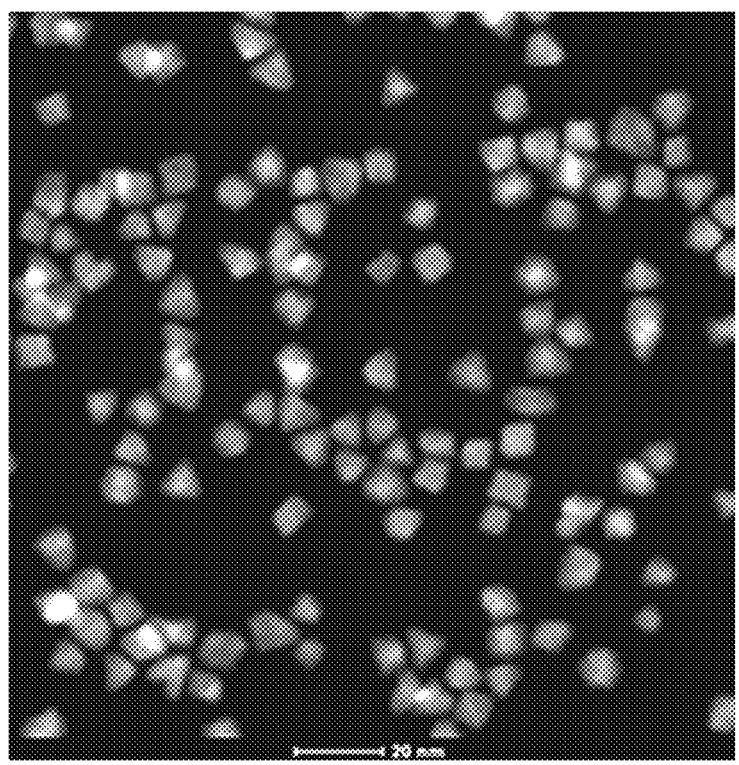
FIG. 7 is a transmission electron microscopic image of the quantum dots (QD1) synthesized in Comparative Example 1.

(3) With respect to the quantum dots as prepared, a transmission electron microscopic analysis is made, and the results are shown in FIG. 7. From the results of FIG. 7, the quantum dots as prepared have an average size of about 8.3 nm and the average number of the pods thereof is less than four.

Comparative Example 1-1

1. A core-shell quantum dot is prepared in the same manner as Example 1 except that tellurium is not used during the preparation of the core.

2. Analysis (1) With respect to the quantum dots as prepared, a photoluminescent analysis is made and the results are summarized in Table 1.

(2) With respect to the quantum dots as prepared, an inductively coupled plasma atomic emission spectroscopic analysis is made and the results are summarized in Table 2.

TABLE 1

|  | PL (nm) | Full Width at Half Maximum (FWHM) (nm) | Quantum Yield (QY) (%) |
|---|---|---|---|
| Example 1 (QD2) | 450 | 21 | 76 |
| Example 2 (QD3) | 454 | 24 | 84 |
| Comparative Example 1 (QD1) | 445 | 23 | 72 |
| Comparative Example 1-1 | 443 | 15 | 76 |

TABLE 2

|  | Te:Se in core | mole ratio (X:Zn) | | | | Te:Se In the quantum dot |
|---|---|---|---|---|---|---|
|  |  | X = S | X = Zn | X = Se | X = Te |  |
| Example 1 (QD2) | 0.04:1 | 0.54:1 | 1:1 | 0.37:1 | 0.005:1 | 0.0135:1 |
| Example 2 (QD3) | 0.05:1 | 0.56:1 | 1:1 | 0.38:1 | 0.005:1 | 0.013:1 |
| Comparative Example 1 (QD1) | 0.04:1 | 0.49:1 | 1:1 | 0.47:1 | 0.001:1 | 0.002:1 |

Morphology Analysis of the Quantum Dots

1. Area Ratio of the Quantum Dots with Respect to a Circumscribed Circle

Figure 8:
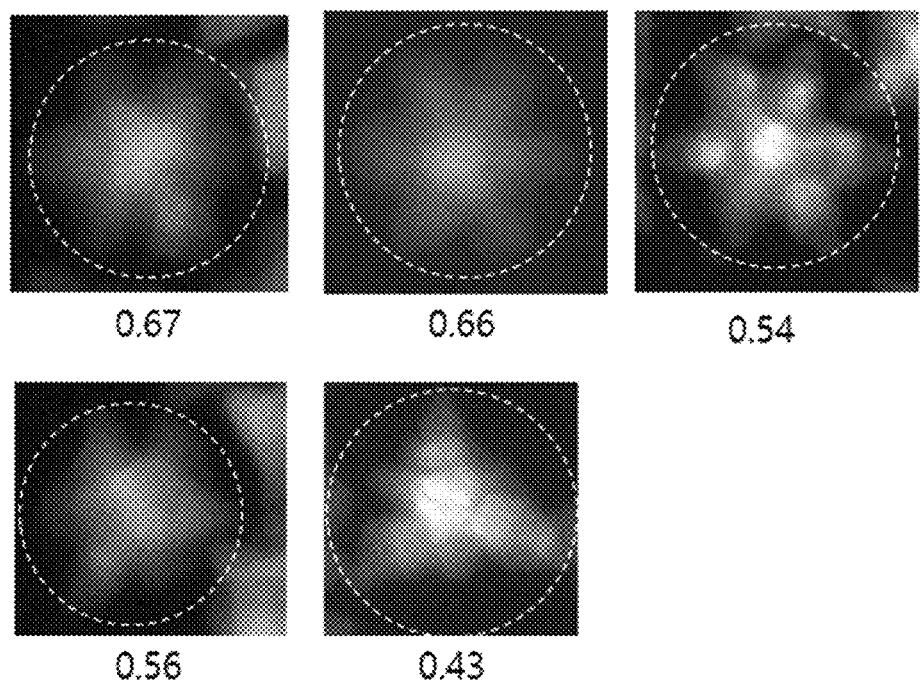
FIG. 8 shows views illustrating each of transmission electron microscopic images of the quantum dots synthesized in Examples together with a circumscribed circle thereof.

An area ratio of the quantum dots with respect to a circumscribed circle is measured for the quantum dots prepared in Examples, and the results are shown in FIG. 8. The results of FIG. 8 show that in case of the quantum dots prepared in the Example, an area ratio with respect to a circumscribed circle is greater than or equal to about 0.4:1 on average.

Figure 9:
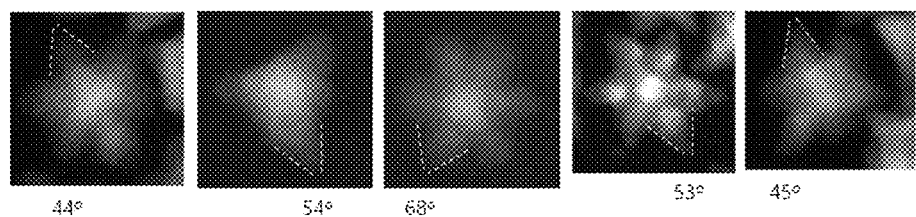
FIG. 9 shows views illustrating each of transmission electron microscopic images of the quantum dots synthesized in Examples together with an edge point angle.

2. Edge Point Angle of the Pod (1) An edge point angle of the pod with respect to a circumscribed circle is measured for the quantum dots prepared in Examples, and the results are shown in FIG. 9. The results of FIG. 9 show that in case of the quantum dots prepared in the Example, the edge point angle of the pod is less than about 70 degrees.

Figure 10:
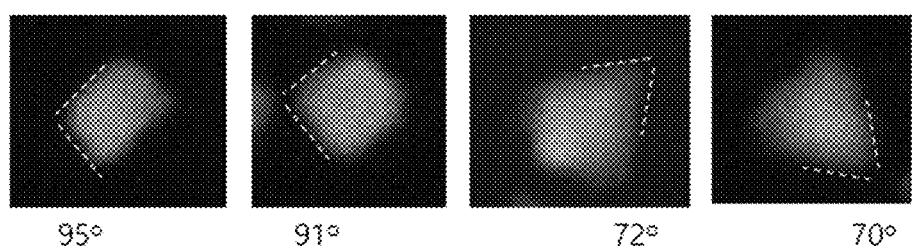
FIG. 10 shows views illustrating each of transmission electron microscopic images of the quantum dots synthesized in Comparative Examples together with an edge point angle thereof.

(2) An edge point angle of the pod with respect to a circumscribed circle is measured for the quantum dots prepared in Comparative Example 1, and the results are shown in FIG. 10. The results of FIG. 10 show that in case of the quantum dots prepared in Comparative Example 1, the edge point angle of the pod is greater than or equal to about 70 degrees on average.

Example 3

A light emitting device is fabricated by using the quantum dot of Example 1 in the following manner. On a glass substrate with an indium tin oxide (ITO) electrode (anode) as deposited, a poly(3,4-ethylenedioxythiophene):poly(styrene sulfonate) (PEDOT:PSS) layer and a PVK layer is formed via a spin coating method as a hole injection layer and a hole transporting layer, respectively. Over the poly (N-vinylcarbazole (PVK) layer thus formed, an octane dispersion of the quantum dots are spin-coated to form a quantum dot emission layer, and over the quantum dot emissive layer, a 8-(4-(4,6-di(naphthalen-2-yl)-1,3,5-triazin-2-yl)phenyl)quinolone):8-hydroxyquinolinato lithium (ET204:Liq) layer is formed as an electron auxiliary layer, over which an aluminum electrode is vapor deposited.

Figure 11:
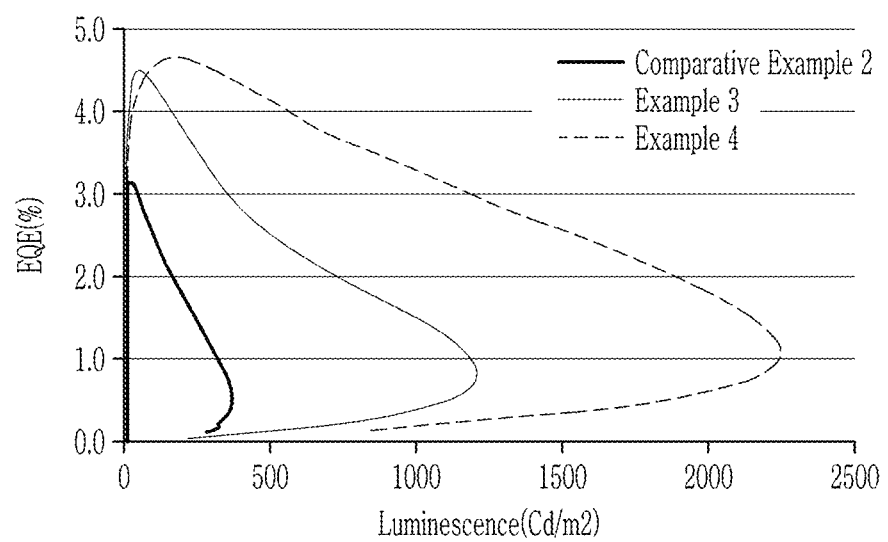
FIG. 11 is a graph of EQE (percent (%)) versus luminescence (candelas per square meter ($Cd/m^2$)) illustrating electroluminescent properties of the devices of Example 3, Example 4, and Comparative Example 2.
Figure 12:
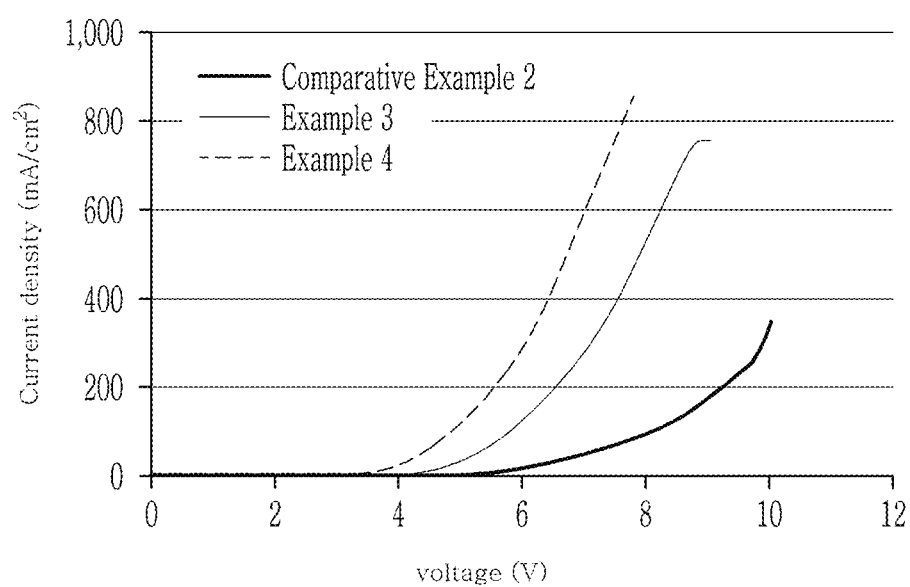
FIG. 12 is a graph of Current density ($mA/cm^2$) versus voltage (V) illustrating electroluminescent properties of the devices of Example 3, Example 4, and Comparative Example 2.

For the prepared device, electroluminescent properties are evaluated and the results are summarized in FIG. 11, FIG. 12, and Table 3.

Example 4

A electroluminescent device is prepared in the same manner as set forth in Example 3 except for using the quantum dots of Example 2 as the quantum dot.

For the prepared device, electroluminescent properties are evaluated and the results are summarized in FIG. 11, FIG. 12, and Table 3.

Comparative Example 2

A electroluminescent device is prepared in the same manner as set forth in Example 3 except for using the quantum dots of Comparative Example 1 as the quantum dot.

For the prepared device, electroluminescent properties are evaluated and the results are summarized in FIG. 11, FIG. 12, and Table 3.

TABLE 3

|  | Max. EQE (%) | EQE @ 100 nit[1] (%) | Max. candelas per ampere (Cd/A) | λmax.[2] (nm) | FWHM (nm) |
|---|---|---|---|---|---|
| Comparative Example 2 | 3.2 | 2.5 | 2.0 | 448 | 26 |
| Example 3 | 4.5 | 4.3 | 2.7 | 450 | 22 |
| Example 4 | 4.7 | 4.6 | 3.1 | 455 | 25 |

[1]nit = candelas per square meter
[2]λmax. = peak emission wavelength

The results of FIG. 11, FIG. 12, and Table 3 confirm that the devices including the quantum dots of Examples may exhibit improved electroluminescent properties in comparison with Comparative Example 1.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising:
    a core comprising a first semiconductor nanocrystal material comprising zinc, tellurium, and selenium; and
    a semiconductor nanocrystal shell disposed directly on the core and comprising zinc, selenium, and sulfur,
    wherein the quantum dot does not comprise cadmium,
    wherein a size of the quantum dot is greater than or equal to about 10 nanometers and less than 50 nanometers,
    wherein the semiconductor nanocrystal shell comprises at least four protrusions, and
    wherein the quantum dot emits blue light.

2. The quantum dot of claim 1, wherein in the quantum dot, a mole ratio of the tellurium with respect to the selenium is greater than or equal to about 0.001:1 and less than or equal to about 0.05:1.

3. The quantum dot of claim 1, wherein
a maximum photoluminescent peak wavelength of the quantum dot is greater than or equal to about 450 nanometers and less than or equal to about 470 nanometers, and
the maximum photoluminescent peak of the quantum dot has a full width at half maximum of less than or equal to about 50 nanometers.

4. The quantum dot of claim 1, wherein the core comprises $ZnTe_xSe_{1-x}$, wherein x is greater than 0 and less than or equal to about 0.05.

5. The quantum dot of claim 1, wherein the semiconductor nanocrystal shell comprises a gradient composition varying in a radial direction from the core toward an outermost surface of the quantum dot.

6. The quantum dot of claim 1, wherein in the semiconductor nanocrystal shell, an amount of the sulfur increases in a radial direction from the core toward an outermost surface of the quantum dot.

7. The quantum dot of claim 1, wherein
the semiconductor nanocrystal shell comprises a first layer disposed directly on the core, and an outer layer disposed on the first layer, and
the first layer comprises a second semiconductor nanocrystal and
the outer layer comprises a semiconductor nanocrystal having a composition different from that of the second semiconductor nanocrystal.

8. The quantum dot of claim 7, wherein the second semiconductor nanocrystal comprises zinc and selenium, and the outer layer comprises zinc and sulfur.

9. The quantum dot of claim 1, wherein at least one of the protrusions of the quantum dot has a length of greater than or equal to about 1 nanometer.

10. The quantum dot of claim 1, wherein in a two-dimensional image obtained from an electron microscopic analysis, an area ratio of the quantum dot with respect to a circumscribed circle is greater than or equal to about 0.4:1, and
wherein the circumscribed circle is a smallest circle completely surrounding the quantum dot and an outermost point of the quantum dot is on a circumference of the circumscribed circle.

11. The quantum dot of claim 1, wherein in a two-dimensional image obtained from an electron microscopic analysis, at least one of the protrusions of the quantum dot has an edge point angle of less than about 70 degrees.

12. The quantum dot of claim 1, wherein the quantum dot has a quantum efficiency of greater than or equal to about 70%.

13. The quantum dot of claim 1, wherein a full width at half maximum of a maximum photoluminescent peak of the quantum dot is less than about 35 nanometers.

14. The quantum dot of claim 1, wherein the quantum dot has a size of greater than or equal to about 11 nanometers.

15. A method of producing the quantum dot of claim 1, which comprises:
preparing a core comprising a first semiconductor nanocrystal comprising zinc, selenium, and tellurium; and
reacting a zinc precursor and a selenium precursor, a sulfur precursor, or a combination thereof in a plurality of steps in the presence of the core and an organic ligand in an organic solvent at a temperature of greater than or equal to about 300° C. to form a semiconductor nanocrystal shell comprising zinc, selenium, and sulfur and having at least four protrusions.

16. The method of claim 15, wherein in the core comprising the first semiconductor nanocrystal, a ratio of the tellurium with respect to the selenium is less than about 0.05:1.

17. The method of claim 15, wherein formation of the semiconductor nanocrystal shell comprises reacting the zinc precursor and the selenium precursor and then reacting the zinc precursor and the sulfur precursor.

18. An electroluminescent device comprising a
first electrode and a second electrode facing each other, and
a light emitting layer disposed between the first electrode and the second electrode,
wherein the light emitting layer comprises a plurality of quantum dots and the plurality of quantum dots comprises the quantum dot of claim 1.

19. The electroluminescent device of claim 18, further comprising a charge auxiliary layer between the first electrode and the light emitting layer, between the second electrode and the light emitting layer, or between the first electrode and the light emitting layer and between the second electrode and the light emitting layer.

20. The electroluminescent device of claim 19, wherein the charge auxiliary layer comprises a charge injection layer, a charge transport layer, or a combination thereof.

21. The electroluminescent device of claim 18, wherein a peak external quantum efficiency of the electroluminescent device is greater than or equal to about 4%.

22. The electroluminescent device of claim 18, wherein the electroluminescent device is configured to emit light having light having a maximum luminous peak wavelength between about 450 nanometers and about 460 nanometers and a full width at half maximum of less than or equal to about 25 nanometers.

23. A display device comprising the electroluminescent device of claim 18.

24. The quantum dot of claim 1, wherein the semiconductor nanocrystal shell comprising zinc, selenium, and sulfur comprises at least four protrusions.

* * * * *